(12) United States Patent
Park

(10) Patent No.: US 8,405,080 B2
(45) Date of Patent: Mar. 26, 2013

(54) TRANSISTOR SUBSTRATE AND MANUFACTURING METHOD OF THE SAME

(75) Inventor: Yong-Hwan Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 58 days.

(21) Appl. No.: 13/042,888

(22) Filed: Mar. 8, 2011

(65) Prior Publication Data

US 2011/0227073 A1 Sep. 22, 2011

(30) Foreign Application Priority Data

Mar. 19, 2010 (KR) .................. 10-2010-0024757

(51) Int. Cl.
*H01L 29/786* (2006.01)
(52) U.S. Cl. ................... 257/57; 257/E33.053
(58) Field of Classification Search .......... 257/57–59, 257/72, 40, E33.053; 438/147–148, 158, 438/163
See application file for complete search history.

(56) References Cited

U.S. PATENT DOCUMENTS

| | | | |
|---|---|---|---|
| 5,892,246 A | 4/1999 | Tsai et al. | |
| 8,026,162 B2 * | 9/2011 | Tanaka et al. | 438/592 |
| 8,278,158 B2 * | 10/2012 | Moon et al. | 438/149 |
| 2007/0090366 A1 | 4/2007 | Hung et al. | |
| 2009/0045402 A1 | 2/2009 | Kuo | |
| 2010/0047946 A1 | 2/2010 | Kim et al. | |
| 2010/0068841 A1 | 3/2010 | Park et al. | |
| 2010/0090208 A1 * | 4/2010 | Moon et al. | 257/40 |
| 2012/0248446 A1 * | 10/2012 | Liu et al. | 257/59 |

FOREIGN PATENT DOCUMENTS

| | | |
|---|---|---|
| JP | 2006100807 | 4/2006 |
| JP | 4072805 | 4/2008 |
| JP | 2009157354 | 7/2009 |
| KR | 100269356 B1 | 7/2000 |
| KR | 1020020071233 A | 9/2002 |
| KR | 20070109279 A | 11/2007 |
| KR | 1020080010781 A | 1/2008 |
| KR | 20080062281 A | 7/2008 |
| KR | 20080081580 A | 9/2008 |
| KR | 20080113967 A | 12/2008 |

OTHER PUBLICATIONS

Korean Registration Determination Certificate issued by the Korean Intellectual Property Office on May 23, 2011, corresponding to Korean Application No. 10-2010-0024757 and Request for Entry of the Accompanying Office Action attached herewith.

* cited by examiner

*Primary Examiner* — Nathan Ha
(74) *Attorney, Agent, or Firm* — Robert E. Bushnell, Esq.

(57) ABSTRACT

A transistor substrate and a method of manufacturing the transistor substrate. The transistor substrate includes a semiconductor layer arranged on a base layer, a first layer arranged on the semiconductor layer and having a first light transmissivity, source and drain electrodes, the source electrode arranged on a first side of the semiconductor layer and extending onto a first portion of the first layer, the drain electrode arranged on a second and opposite side of the semiconductor layer and extending onto a second portion of the first layer and separated from the source electrode by a distance, a second layer arranged between the first layer and the source and drain electrodes and having a second light transmissivity that is lower than the first light transmissivity, a gate insulating layer arranged on the first layer and a gate electrode arranged on the gate insulating layer.

20 Claims, 10 Drawing Sheets

TRANSISTOR SUBSTRATE AND MANUFACTURING METHOD OF THE SAME

CLAIM OF PRIORITY

This application makes reference to, incorporates the same herein, and claims all benefits accruing under 35 U.S.C. §119 from an application earlier filed in the Korean Intellectual Property Office on 19 Mar. 2010 and there duly assigned Serial No. 10-2010-0024757.

BACKGROUND OF THE INVENTION

1. Field of the Invention

The present invention relates to a transistor substrate and a manufacturing method of the same.

2. Description of the Related Art

A mask having a fine pattern is transferred to a transistor substrate including a thin film transistor (TFT) and wirings in order to form a fine structure pattern on the transistor substrate.

A process of transferring a pattern using a mask uses a photolithographic process using a photomask. According to the photolithographic process, photoresist is uniformly coated on a substrate, a photomask having a pattern is aligned to the substrate, and the substrate is exposed to light using a light exposure device such as a stepper. The substrate undergoes a series of processes including developing the exposed photoresist (e.g., positive photoresist), etching the pattern by using the remaining photoresist pattern to form a desired pattern, and removing a remaining part of the photoresist.

Since a series of processes of forming a pattern using a photomask are complicated, manufacturing cost and manufacturing time increase with an increase in the number of processes using the photomask. Also, a substrate and a photo mask are required to be precisely aligned in order to form a fine pattern.

SUMMARY OF THE INVENTION

The present invention provides a transistor substrate capable of reducing the number of photomask processes and precisely aligning a substrate and a photomask and a method of manufacturing the transistor substrate.

According to an aspect of the present invention, there is provided a transistor substrate including a semiconductor layer arranged on a base layer, a first layer arranged on the semiconductor layer and having a first light transmissivity, source and drain electrodes, the source electrode arranged on a first side of the semiconductor layer and extending onto a first portion of the first layer, the drain electrode arranged on a second and opposite side of the semiconductor layer and extending onto a second portion of the first layer and separated from the source electrode by a distance, a second layer arranged between the first layer and the source and drain electrodes and having a second light transmissivity that is lower than the first light transmissivity, a gate insulating layer arranged on the first layer and a gate electrode arranged on the gate insulating layer.

The first layer may include a material that has etch selectivity with respect to the source and drain electrodes and the second layer. Inner sides of the source and drain electrodes and an inner side of the second layer may be arranged on a same plane. Outer sides of the source and drain electrodes and an outer side of the semiconductor layer may be arranged on a same plane. An outer side of the first layer and an outer side of the second layer may be arranged on a same plane. The source and drain electrodes may directly contact the semiconductor layer. The first light transmissivity may be greater than 50% and less than 100%, and the second light transmissivity may be greater than 0% and less than 50%. The first layer may include silicon oxide, and the second layer may include a material selected from a group consisting of amorphous silicon and doped amorphous silicon. The source and drain electrodes may include a plurality of ohmic contact layers and a metal layer arranged on the ohmic contact layers. A portion of the semiconductor layer on which the first layer is not arranged comprises impurities. The transistor substrate may also include an alignment key spaced apart from the semiconductor layer by a distance and comprising a third layer comprised of a same material as that of the second layer. The alignment key may also include a fourth layer arranged underneath the third layer and comprising a same material as that of the first layer.

According to another aspect of the present invention, there is provided a method of manufacturing a transistor substrate, including sequentially forming a semiconductor layer, a first layer and a second layer on a base layer by patterning the first and second layers using a first photomask process so that outer sides of the first and second layers are arranged on a same plane, wherein the first layer has a first light transmissivity and the second layer has a second and lower light transmissivity, forming source and drain electrodes by depositing a material for the source and drain electrodes on the resultant structure of the first photomask process and patterning the deposited material via a second photomask process, wherein the source electrode is connected to a first side of the semiconductor layer and extends onto a first portion of the second layer, and the drain electrode is connected to a second and opposite side of the semiconductor layer and extends onto a second portion of the second layer and is spaced-apart from the source electrode by a distance, wherein inner sides of the source and drain electrodes and an inner side of the second layer are arranged on a same plane and forming a gate electrode at a location that corresponds to the semiconductor layer by depositing an insulating layer and then a material for a gate electrode on the resultant structure of the second photomask process and then patterning the material for the gate electrode via a third photomask.

The method may also include forming alignment keys spaced apart from the semiconductor layer by a distance and at corners of the base layer, the alignment keys comprising a third layer comprised of a same material as that of the second layer. The alignment keys may also include a fourth layer arranged underneath the third layer and comprising a same material as that of the first layer. The source and drain electrodes may be patterned so that outer sides of the source and drain electrodes and an outer side of the semiconductor layer are arranged on a same plane. The first layer may include a material that has an etch selectivity with respect to the source and drain electrodes and the second layer. The method may also include forming ohmic contact layers by depositing a material for the ohmic contact layers and then patterning the material for the ohmic contact layers during the second photomask process. The second photomask process may also include etching the second layer in a same process as the patterning of the material for the ohmic contact layers.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
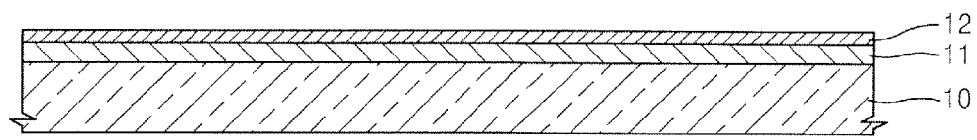
FIGS. 1 through 8 are cross-sectional views and a plan view schematically illustrating a transistor substrate and a method of manufacturing the transistor substrate according to a first embodiment of the present invention.

Turning now to FIGS. 1 through 8, FIGS. 1 through 8 are cross-sectional views and a plan view schematically illustrating a transistor substrate and a method of manufacturing the transistor substrate according to a first embodiment of the present invention. Referring to FIG. 1, a buffer layer 11 and a layer 12, which includes a material of which a semiconductor layer 22 will later be formed, are deposited on a base layer 10.

The base layer 10 may be made out of a transparent glass material including SiO2 as a main component. The base layer 10 may also be made out of an opaque material or another material such as a plastic material.

The buffer layer 11 is deposited on the base layer 10. The buffer layer 11 includes SiO2 and/or SiNx in order to improve smoothness of the base layer 10 and prevent impure elements from permeating into the base layer 10. The layer 12 is then deposited on the buffer layer 11.

The buffer layer 11 and the layer 12 may be deposited using various deposition techniques, including plasma enhanced chemical vapor deposition (PECVD), atmospheric pressure CVD (APCVD), lower pressure CVD (LPCVD), and the like.

The material for layer 12 of which the semiconductor layer 22 is to be formed may be amorphous silicon or polysilicon. Here, the amorphous silicon may be crystallized to form the polysilicon. The amorphous silicon may be crystallized using various techniques, including rapid thermal annealing (RTA), solid phase crystallization (SPC), excimer laser annealing (ELA), metal induced crystallization (MIC), metal induced lateral crystallization (MILC), sequential lateral solidification (SLS), and the like.

Figure 2:
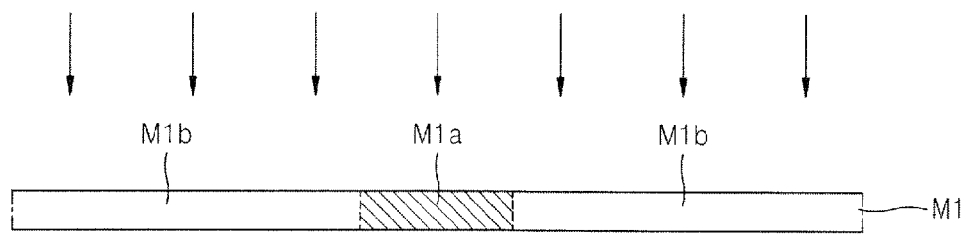
Figure 2:
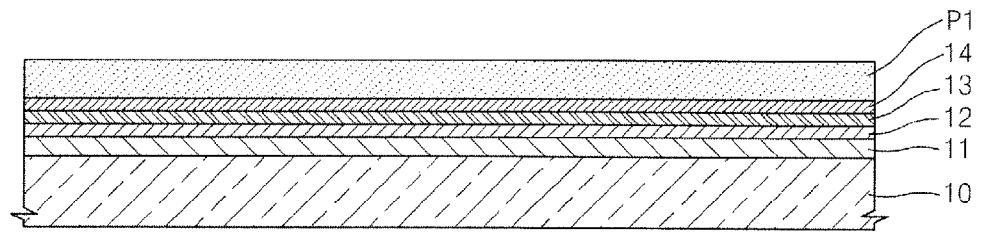

Referring to FIG. 2, a layer 13, which includes a material of which a first layer 23 will be formed, and a layer 14, which includes a material of which a second layer 24 will be formed, are sequentially deposited in the stated order on the layer 12. Here, the first layer 23 will function as an etch stop layer when layer 12 is patterned to produce semiconductor layer 22, which will be described later, and the second layer 24 is critical in the formation of the alignment key 30 at the corners of the substrate, which will also be described later.

A material having high light transmissivity, such as silicon oxide or silicon nitride, may be used as the material for layer 13 which, when patterned, will be first layer 23. For example, a material having light transmissivity greater than 50% and less than 100% may be used as the material to produce first layer 23. Another constraint regarding what material can be used to produce first layer 23 is that the material must serve as an etch stop when the layer 12 is later etched and patterned to produce semiconductor layer 22, which will be described later.

A material having lower light transmissivity than the light transmissivity of the first layer 23 may be used as a material in layer 14 used to produce second layer 24. For example, a material having light transmissivity greater than 0% and less than 50% may be used as the material in forming second layer 24. For example, the same type of silicon-based material as that of the semiconductor layer 22 may be used as the material of the second layer 24. For example, amorphous silicon or amorphous silicon doped with ion impurities may be used as the material of the second layer 24. The ion impurities may be n+ type or p+ type.

Figure 3:
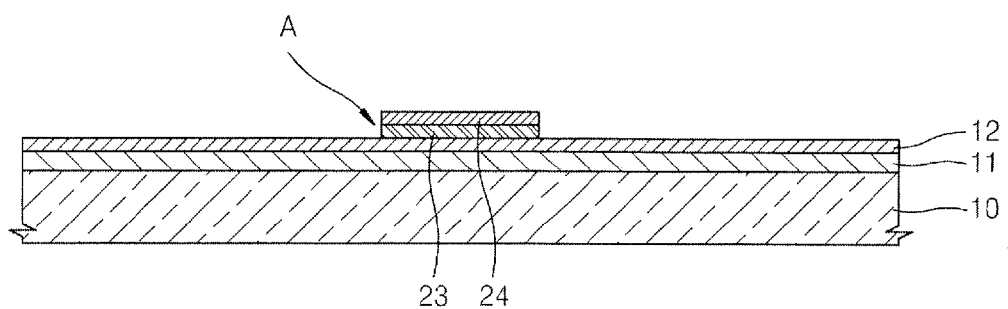

First photoresist layer "P1" is coated on the layer 14, and a first photomask process is performed using a first photomask "M1" having a light-blocking part "M1a" and a light-transmitting part "M1b." The first photomask "M1" is exposed to light using a light exposure device (not shown) and then the substrate undergoes a series of processes including developing, etching, and stripping or ashing. Referring to FIG. 3, first and second layers 23 and 24 having predetermined patterns are formed on the layer 12 as the result of the first photomask "M1." Since the first and second layers 23 and 24 are simultaneously patterned using the first photomask "M1," outer sides of the first and second layers 23 and 24 form the same etched sides "A" where the outer edges of first and second layers 23 and 24 are arranged in a same plane.

Figure 4A:
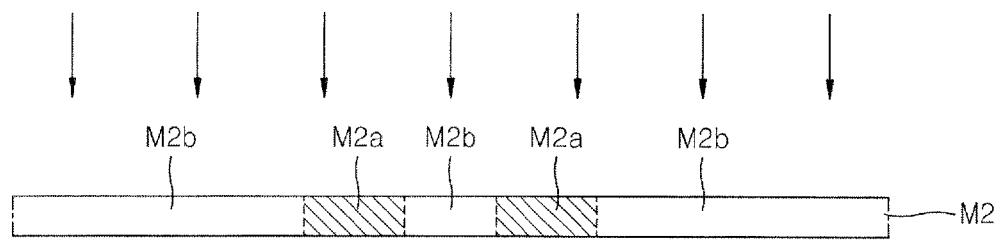

Referring to FIG. 4A, a layer 15, which includes a material of which ohmic contact layers 25a and 25b ware to be formed, and a layer 16, which includes a material of which source and drain electrodes 26 are to be formed, are sequentially deposited in the stated order on the resultant structure of FIG. 3.

Amorphous silicon doped with ion impurities may be used as the material for layer 15. The ion impurities may be n+ type or p+ type. As will be described later in conjunction with the second and third embodiments of FIGS. 16 through 18, ohmic contact layers 25a and 25b are not always required depending on the type of a TFT, and therefore a process of depositing layer 15 and producing ohmic contact layers 25a and 25b may be omitted.

Second photoresist "P2" is coated on the layer 16, and a second photomask processes are performed using a second photomask "M2" including a light-blocking part "M2a" and a light-transmitting part "M2b." Although not shown in detail in the drawings, the second photomask "M2" is exposed to light using the light exposure device and then undergoes a series of processes including developing, etching, and stripping or ashing.

Here, the second photomask "M2" is precisely aligned with the base layer 10 during the exposure of light in order to form fine patterns of the source and drain electrodes. Alignment keys, which are alignment marks used to align a mask to a substrate, are required to be formed in an area of the base layer 10 in order to perform a precise alignment.

Figure 4B:
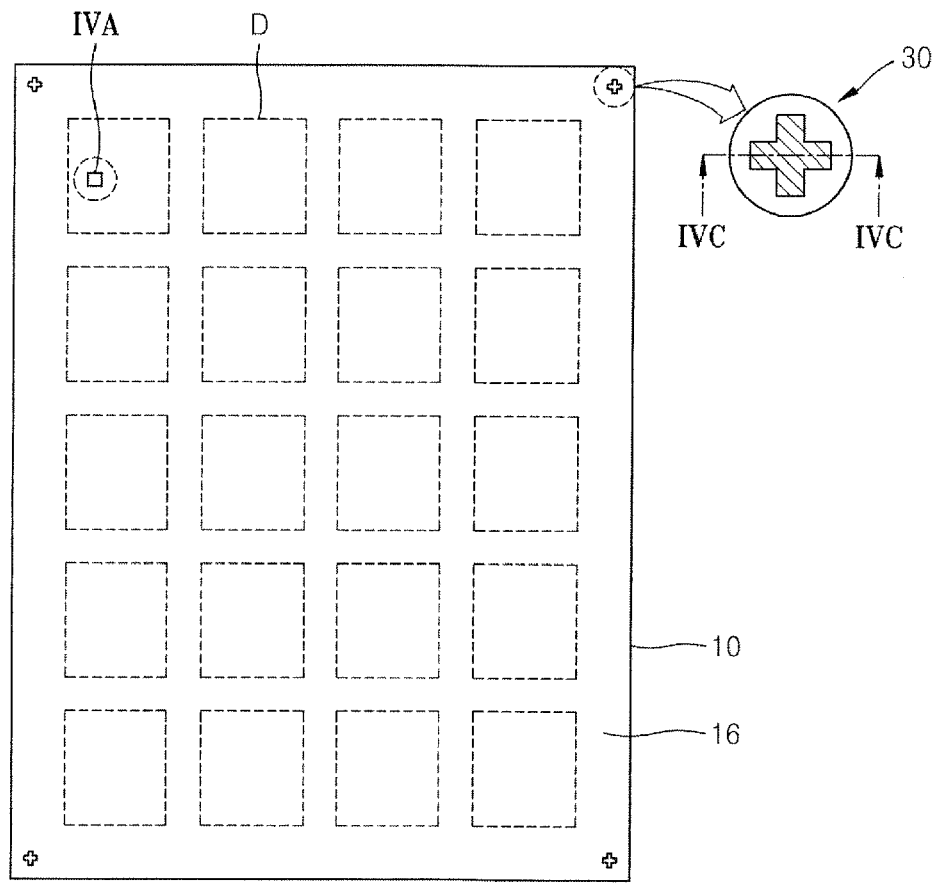

The alignment keys will now be discussed in conjunction with FIGS. 4B through 4D. Turning now to FIG. 4B, FIG. 4B is a schematic plan view of a transistor substrate in which alignment keys are formed in the same process as that described with reference to FIG. 4A. Referring to FIG. 4B, a plurality of cell areas "D", in which a plurality of TFTs are to be disposed, are formed on the base layer 10, wherein the plurality of TFTs will be described later. Four alignment keys 30 are formed at corners of the base layer 10. Each of the cell areas "D" may be used as a display of a display apparatus such as an organic light-emitting display apparatus or a liquid crystal display (LCD) apparatus.

The alignment keys 30 have cross shapes in FIG. 4B, but these are merely examples as the shapes of the alignment keys 30 may be modified to have other various shapes. Also, the number of alignment keys 30 may be changed.

Figure 4C:
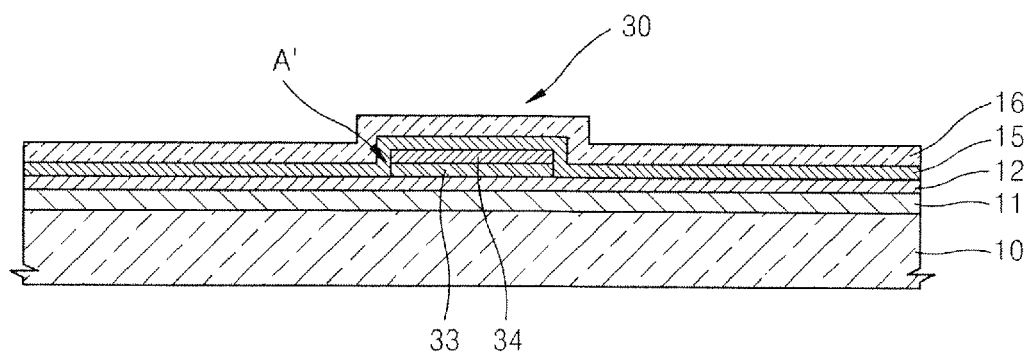

Turning now to FIG. 4C, FIG. 4C is a schematic cross-sectional view of an alignment key 30 taken along a line IVC-IVC of FIG. 4B. Referring to FIG. 4C, in the alignment key 30, a fourth layer 33 including the same material as that of the first layer 23 and a third layer 34 including the same material as that of the second layer 24 are sequentially stacked in the stated order on the layer 12.

The fourth and third layers 33 and 34 of the alignment key 30 are simultaneously formed using the second photomask "M2" when the first and second layers 23 and 24 constituting the TFTs in the cell areas "D" are formed in the second photomask process. Thus, etched sides "A'" (not shown) of outer sides of the fourth and third layers 33 and 34 of the alignment key 30 have the same shapes and reside in a same plane.

The layers 15 and 16 are sequentially stacked in the stated order on the fourth and third layers 33 and 34 of the alignment key 30. As previously described, the layer 15 may be omitted and only the layer 16 may be stacked. Here, the layer 16 is not patterned.

The fourth layer 33 of the alignment key 30 may include a transparent material such as silicon oxide or silicon nitride. The third layer 34 of the alignment key 30 may include a material having lower light transmissivity than that of the fourth layer 33, e.g., amorphous silicon or amorphous silicon doped with ion impurities.

The alignment key 30 provides an aligning basis when the second photomask "M2" is aligned with the base layer 10 in the second photomask process, i.e., a process of forming the patterns of the source and drain electrodes.

Figure 4D:
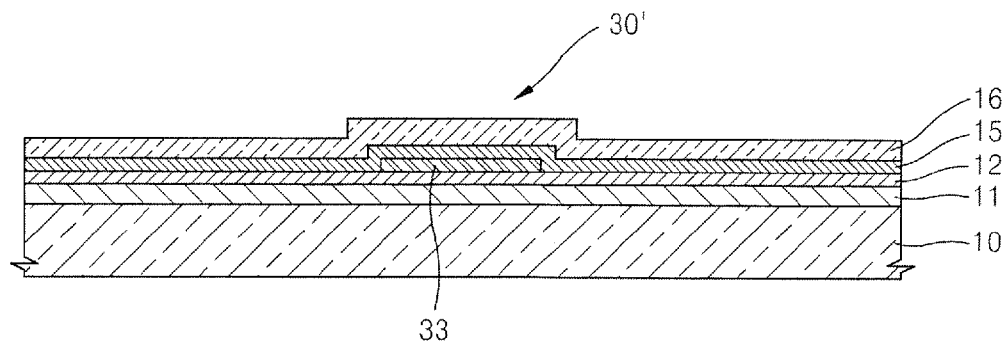

Turning now to FIG. 4D, FIG. 4D is a schematic cross-sectional view of an alignment key 30' for comparing with the alignment key 30 illustrated in FIG. 4C. Referring to FIG. 4D, in the alignment key 30', only a fourth layer 33 is formed on a layer 12, which includes a material of which a semiconductor layer is to be formed. A layer 15, which includes a material of ohmic contacts layer, and a layer 16, which includes a material of source and drain electrodes, are stacked on the fourth layer 33.

If a pattern of the alignment key 30' is made out of only a transparent material such as silicon oxide or silicon nitride (i.e., layer 13 without layer 14), an optical system of a light exposure device (not shown) fails to detect a position of the conventional alignment key 30'. However, when the third layer 34 of the alignment key 30 of FIG. 4C, which has low light transmissivity, such as amorphous silicon or amorphous silicon that is doped with ion impurities, is formed on the fourth layer 33 of the alignment key 30, an optical system of the light exposure device (not shown) easily detects a location of the alignment key 30. As a result, a precise alignment is achieved.

Figure 5:
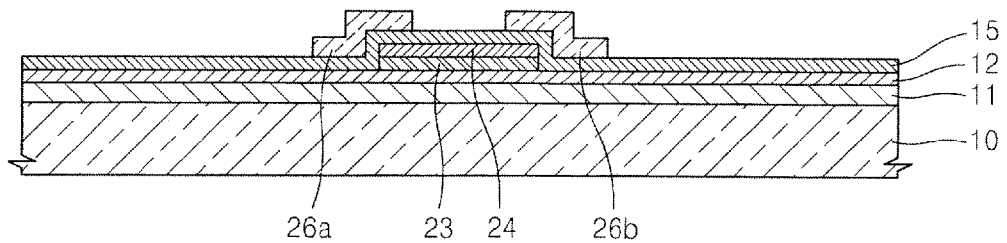
Figure 6:
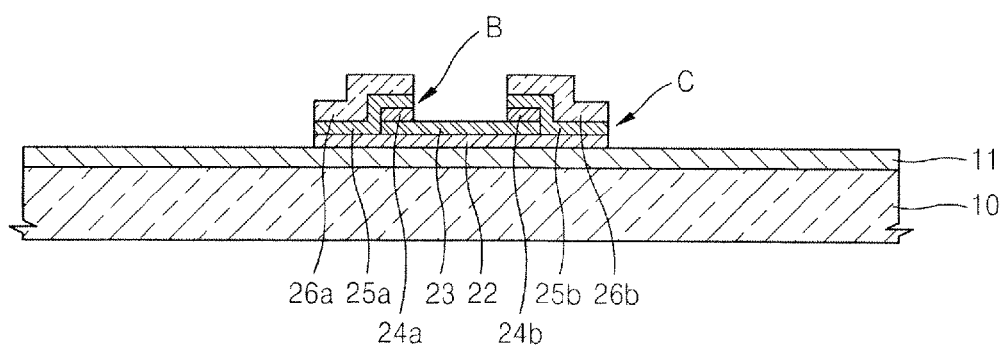

Back to the process according to the first embodiment of the present invention, after the second photomask processes of exposure, developing and stripping/ashing have been carried out on the structure of FIG. 4A, a source electrode 26a and a drain electrode 26b are formed as illustrated in FIG. 5. As illustrated in FIG. 6, a semiconductor layer 22, ohmic contact layers 25a and 25b, and second layers 24a and 24b are simultaneously formed using patterns of the source and drain electrodes 26a and 26b as masks. Here, etched sides "B" of inner sides of the source and drain electrodes 26a and 26b, the ohmic contact layers 25a and 25b, and the second layers 24a and 24b are arranged on a same plane and have the same shapes. Also, etched sides "C" of outer sides of the source and drain electrodes 26a and 26b, the ohmic contact layers 25a and 25b, and the semiconductor layer 22 are arranged on a same plane and have same shapes.

As previously described, the semiconductor layer 22 may be made out of amorphous silicon or polysilicon, the ohmic contact layers 25a and 25b may be made out of amorphous silicon doped with ion impurities, and the second layers 24a and 24b may be made out of amorphous silicon or silicon doped with ion impurities. The semiconductor layer 22, the ohmic contact layers 25a and 25b, and the second layers 24a and 24b are made out of silicon-based materials and thus have similar etch rates. Therefore, the ohmic contact layers 25a and 25b, the second layers 24a and 24b, and the semiconductor layer 22 may be simultaneously etched by using the source and drain electrodes 26a and 26b as etch masks and using the same etchant.

The first layer 23 includes a material having etch selectivity with respect to the source and drain electrodes 26a and 26b and the second layers 24a and 24b. Here, the material having etch selectivity refers to a material which has a relatively lower etch rate than materials included in the source and drain electrodes 26a and 26b and the second layers 24a and 24b, and thus operates as an etch stop layer in a process of etching the source and drain electrodes 26a and 26b.

In the first embodiment illustrated in FIGS. 5 and 6, the source and drain electrodes 26a and 26b are first formed using the second photomask "M2," and then the semiconductor layer 22, the ohmic contact layers 25a and 25b, and the second layers 24a and 24b are formed using the source and drain electrodes 26a and 26b as the etch masks, however the present invention is not limited thereto. For example, if an etchant capable of simultaneously etching a metallic material of the source and drain electrodes 26a and 26b and the silicon-based materials of the semiconductor layer 22, the ohmic contact layers 25a and 25b, and the second layers 24a and 24b is used, the processes illustrated with reference to FIGS. 5 and 6 may be performed using one etching process.

Figure 7:
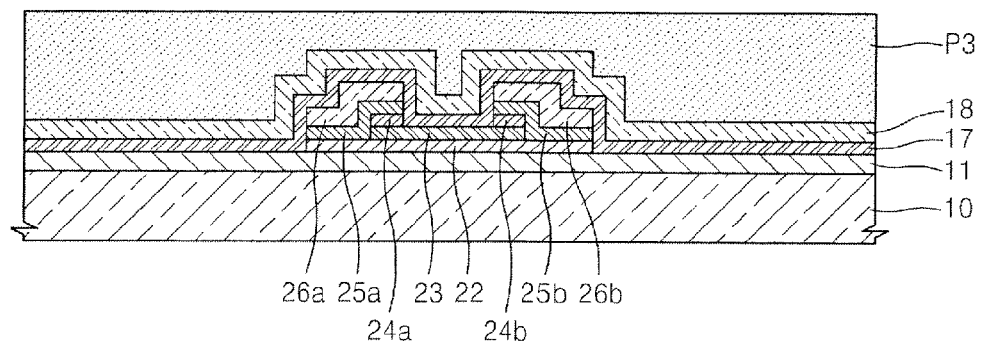

Turning now to FIG. 7, a layer 17, which includes a material of a gate insulating layer and a layer 18, which includes a material of a gate electrode, are sequentially deposited in the stated order on the resultant structure of FIG. 6. One or more conductive materials selected from the group consisting of Ag, Mg, Al, Pt, Pd, Au, Ni, Nd, Ir, Cr, Li, Ca, Mo, Ti, W, MoW, and Al/Cu may be used in layer 18 to produce gate electrode 28.

Third photoresist layer "P3" is coated on the layer 18, and third photomask processes are performed using a third photomask "M3" having a light-blocking part "M3a" and a light-transmitting part "M3b" to pattern the layer 18. Although not shown in detail in the drawings, the third photomask "M3" is exposed to light using the light exposure device and undergoes a series of processes including developing, etching, and stripping or ashing. The third photomask "M3" is precisely aligned with the base layer 10 in order to form a fine pattern of the gate electrode. Here, the alignment keys 30 formed at the corners of the base layer 10 are used to achieve the precise alignment. The gate insulating layer 17 and the layer 18 used in the third photomask process may be further stacked on the alignment keys 30.

Figure 8:
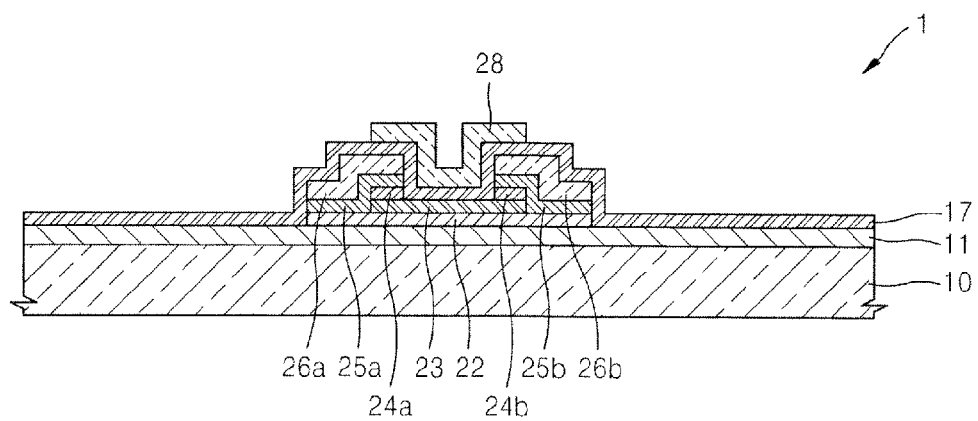

Turning now to FIG. 8, upon the formation of gate electrode 28, a completed TFT 1 is the result of the third photomask processes. A transistor substrate including the TFT 1 according to the first embodiment may be manufactured using only three photomask processes using only three photomasks "M1," "M2," and "M3."

Although not shown in the drawings, a precise alignment may be performed using the alignment key 30 including the fourth layer 33 formed at an edge of the transistor substrate and the third layer 34 having a lower light transmissivity than the fourth layer 33 in order to achieve precise patterning.

Figure 9:
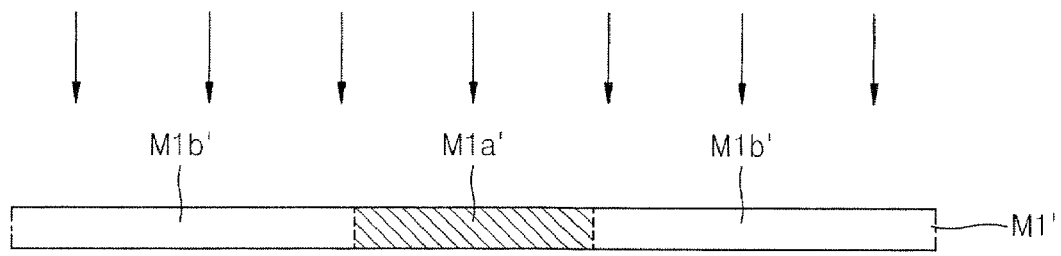
FIGS. 9 through 15 are cross-sectional views schematically illustrating a transistor substrate and a method of manufacturing transistor substrate.
Figure 9:
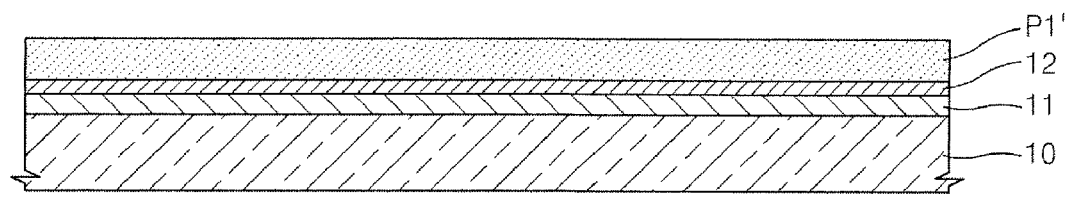

Turning now to FIGS. 9 through 15, FIGS. 9 through 15 are schematic cross-sectional views illustrating a transistor substrate and a method of manufacturing the transistor substrate. Turning now to FIG. 9, a buffer layer 11 and a layer 12, which includes a material of a semiconductor layer 22, are sequentially deposited on a base layer 10. First photoresist "P1'" is coated on the layer 12, and a first photomask process is performed using a first photomask "M1'" including a light-blocking part "M1a'" and a light-transmitting part "M1b'."

Figure 10:
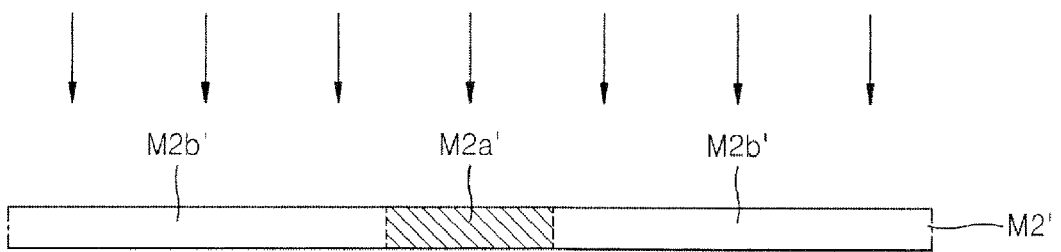
Figure 10:
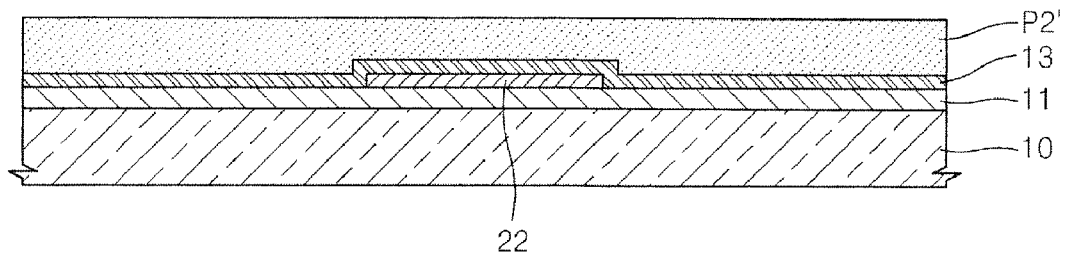

Turning now to FIG. 10, a semiconductor layer 22 is formed as the result of the first photomask process, and a layer 13, which includes a material of a first layer, is stacked on the semiconductor layer pattern 22. Although not shown in the drawings, when the semiconductor layer 22 is formed, alignment keys (not shown) are formed at the corners of base layer 10 and are of the same material as that of the semiconductor layer 22. Thus, the alignment keys may be used in second through fourth photomask processes which will be described later.

Second photoresist layer "P2" is coated on the layer 13, and the second photomask processes are performed using a second photomask "M2" including a light-blocking part "M2a'" and a light-transmitting part "M2b'."

Figure 11:
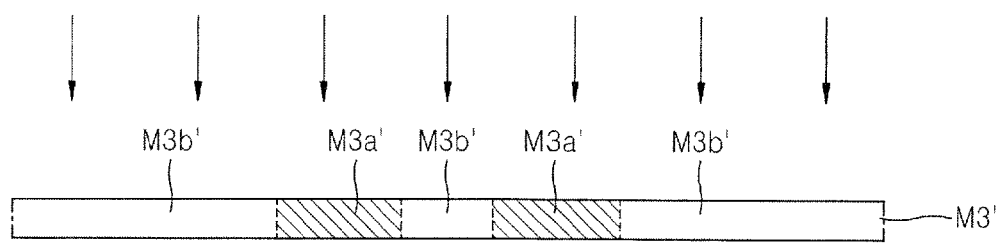
Figure 12:
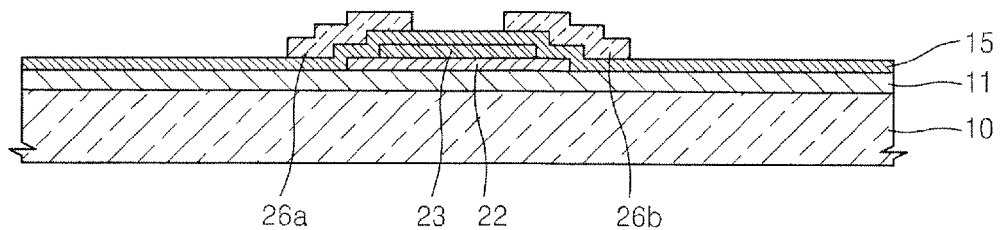

Turning now to FIG. 11, a first layer 23 is formed as the result of the second photomask processes, and a layer 15, which includes a material for ohmic contact layers, and a layer 16, which includes a material for source and drain electrodes, are deposited on the first layer 23. Third photoresist layer "P3'" is coated on the layer 16, and the third photomask processes are performed using a third photomask "M3'" including a light-blocking part "M3a'" and a light-transmitting part "M3b'." Referring to FIG. 12, source and drain electrodes 26a and 26b are formed as the result of the third photomask processes.

Figure 13:
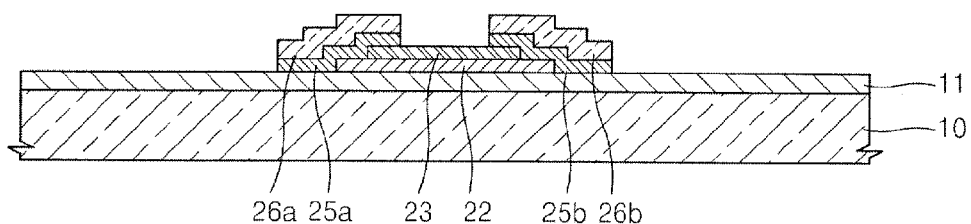

Referring to FIG. 13, the ohmic contact layers 25a and 25b are formed using patterns of the source and drain electrodes 26a and 26b as etch masks.

Figure 14:
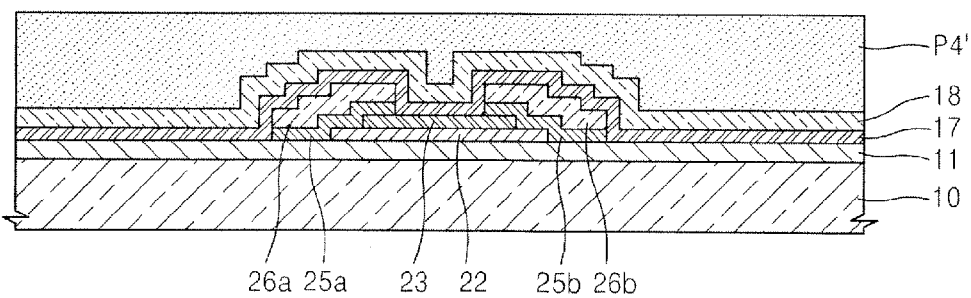
Figure 15:
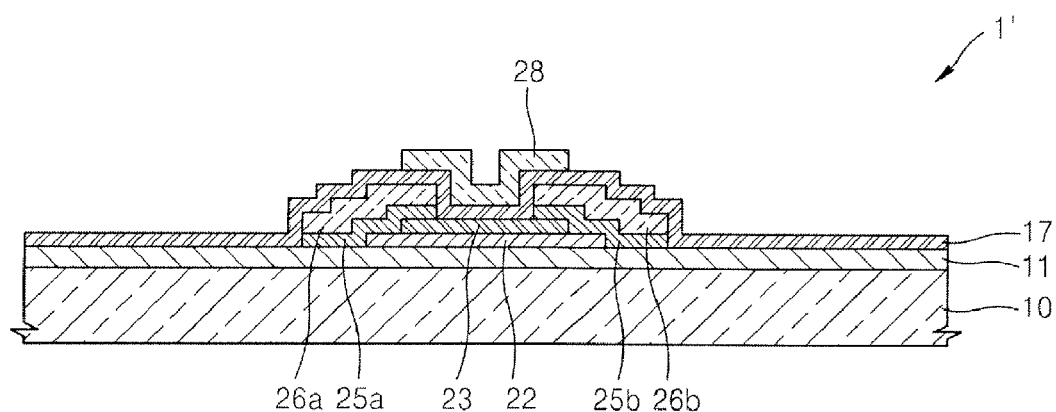

Referring to FIG. 14, a gate insulating layer 17 and a layer 18, which includes a material for forming a gate electrode 28, are sequentially deposited in the stated order on the resultant structure of FIG. 13. Fourth photoresist layer "P4" is coated on the layer 18, and the fourth photomask processes are performed using a fourth photomask "M4'" including a light-blocking part "M4a'" and a light-transmitting part "M4b'" to pattern the layer 18. Referring to FIG. 15, a TFT 1' is formed as the result of the fourth photomask process.

The transistor substrate process illustrated in FIGS. 9 through 15 is manufactured through four sets of photomask processes using four masks "M1'," "M2'," "M3'," and "M4'." The transistor substrate TFT 1 of FIG. 8 is manufactured through only three photomask processes using only three photomasks "M1," "M2," and "M3." In addition, the TFT 1 of FIG. 8 uses the alignment key 30 including the third layer 34 formed on the fourth layer 33 and having a lower light transmissivity than that of the fourth layer 33. Thus, the precise alignment is performed to achieve precise patterning. Therefore, according to the transistor substrate and the method of manufacturing the transistor substrate according to the first embodiment, complicated processes are reduced. As a result, manufacturing cost is considerably lowered through the reductions in process time and material cost.

Figure 16:
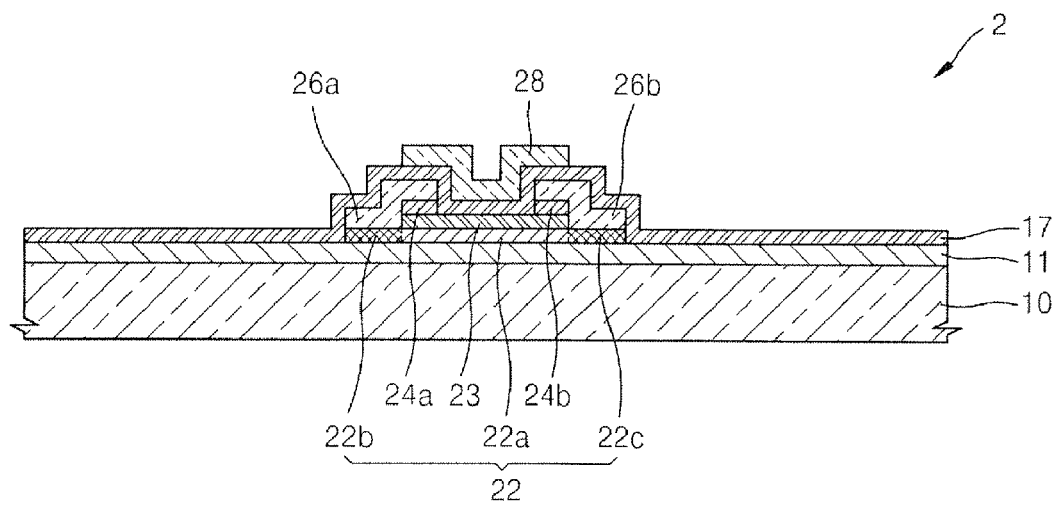
FIGS. 16 and 17 are cross-sectional views schematically illustrating a transistor substrate and a method of manufacturing the transistor substrate, according to a second embodiment of the present invention.
Figure 17:
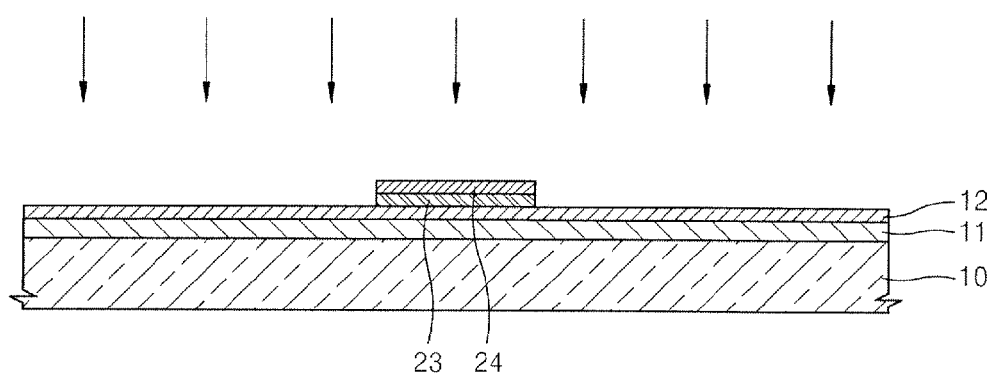

Turning now to FIGS. 16 and 17, FIGS. 16 and 17 are schematic cross-sectional views illustrating a transistor substrate and a method of manufacturing the transistor substrate according to a second embodiment of the present invention. The second embodiment will be described in brief in terms of its differences from that of the first embodiment.

Referring to FIG. 16, a TFT 2 according to the second embodiment includes source and drain electrodes 22b and 22c which are formed at an outer side of a channel layer 22a of a semiconductor layer 22 and doped with ion impurities, and exclude the ohmic contact layers 25a and 25b of the TFT 1 of FIG. 8.

Referring to FIG. 17, a layer 12, which includes a material for the semiconductor layer 22, is doped with ion impurities. Before the first photomask process is performed, a process of crystallizing the layer 12 may be further performed. Although not shown in detail in FIG. 17, a first layer 23 and a second layer 24 are formed using a first photomask process, as described with reference to FIG. 2. The ion impurities are doped using the first and second layers 23 and 24 as ion impurity injection masks. Here, the ion impurities may be n+ type or p+ type.

In other words, according to the transistor substrate TFT 2 manufacturing according to the second embodiment of the present invention, the source and drain electrodes 22b and 22c may be formed without an additional mask process.

Figure 18:
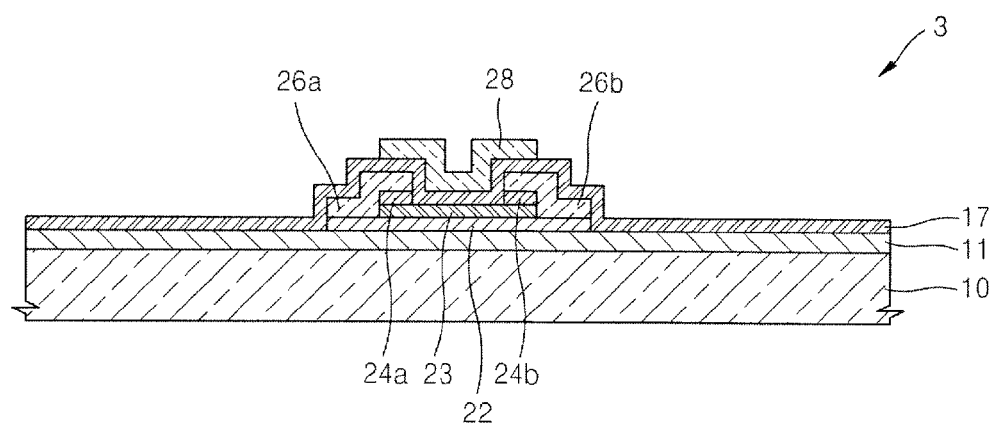
FIG. 18 is a schematic cross-sectional view of a part of a transistor substrate according to a third embodiment of the present invention.

Turning now to FIG. 18, FIG. 18 is a schematic cross-sectional view of a part of a transistor substrate according to a third embodiment of the present invention. The third embodiment will be described in brief in terms of its differences from the first and second embodiments.

Turning now to FIG. 18, a TFT 3 according to the third embodiment excludes the ohmic contact layers 25a and 25b of the TFT 1 of FIG. 8 and the source and drain electrodes 22b and 22c doped with the ion impurities, which are formed at the outer side of the channel layer 22a of the semiconductor layer 22 of the TFT 2 of FIG. 16. The TFT 3 according to the third embodiment may have a structure in which the semiconductor layer 22 is made out of an amorphous silicon-based material, but is not limited thereto.

Although not shown in detail in the drawings, the transistor substrates including the TFTs 2 and 3 of FIGS. 16 through 18 include alignment keys 30 which are formed at corners of base layers 10 and include fourth and third layers 33 and 34, like the transistor substrate TFT 1 of FIG. 8. Therefore, the transistor substrate is manufactured through three photomask processes using three photomasks "M1," "M2," and "M3" as in the previous embodiments.

As described above, in a transistor substrates and the methods of manufacturing the transistor substrates according to the present invention, a precise alignment may be achieved using non-transparent alignment keys. Also, the transistor substrates may be manufactured using only three sets of photomask processes using only three photomasks. Thus, process time and manufacturing cost may be reduced.

Since elements illustrated in the drawings may be enlarged or reduced for convenience of the description, the present invention is not confined to sizes or shapes of the elements. It will be understood by those of ordinary skill in the art that various changes in form and details may be made therein without departing from the spirit and scope of the present invention as defined by the following claims.

What is claimed is:

1. A transistor substrate, comprising:
a semiconductor layer arranged on a base layer;
a first layer arranged on the semiconductor layer and having a first light transmissivity;

source and drain electrodes, the source electrode arranged on a first side of the semiconductor layer and extending onto a first portion of the first layer, the drain electrode arranged on a second and opposite side of the semiconductor layer and extending onto a second portion of the first layer and separated from the source electrode by a distance;

a second layer arranged between the first layer and the source and drain electrodes and having a second light transmissivity that is lower than the first light transmissivity;

a gate insulating layer arranged on the first layer; and a gate electrode arranged on the gate insulating layer.

2. The transistor substrate of claim 1, wherein the first layer comprises a material that has etch selectivity with respect to the source and drain electrodes and the second layer.

3. The transistor substrate of claim 1, wherein inner sides of the source and drain electrodes and an inner side of the second layer are arranged on a same plane.

4. The transistor substrate of claim 1, wherein outer sides of the source and drain electrodes and an outer side of the semiconductor layer are arranged on a same plane.

5. The transistor substrate of claim 1, wherein an outer side of the first layer and an outer side of the second layer are arranged on a same plane.

6. The transistor substrate of claim 1, wherein the source and drain electrodes directly contact the semiconductor layer.

7. The transistor substrate of claim 1, wherein the first light transmissivity is greater than 50% and less than 100%, and the second light transmissivity is greater than 0% and less than 50%.

8. The transistor substrate of claim 1, wherein the first layer comprises silicon oxide, and the second layer comprises a material selected from a group consisting of amorphous silicon and doped amorphous silicon.

9. The transistor substrate of claim 1, wherein the source and drain electrodes comprise:

a plurality of ohmic contact layers; and a metal layer arranged on the ohmic contact layers.

10. The transistor substrate of claim 1, wherein a portion of the semiconductor layer on which the first layer is not arranged comprises impurities.

11. The transistor substrate of claim 1, further comprising an alignment key spaced apart from the semiconductor layer by a distance and comprising a third layer comprised of a same material as that of the second layer.

12. The transistor substrate of claim 11, wherein the alignment key further comprises a fourth layer arranged underneath the third layer and comprising a same material as that of the first layer.

13. A method of manufacturing a transistor substrate, comprising:

sequentially forming a semiconductor layer, a first layer and a second layer on a base layer by patterning the first and second layers using a first photomask process so that outer sides of the first and second layers are arranged on a same plane, wherein the first layer has a first light transmissivity and the second layer has a second and lower light transmissivity;

forming source and drain electrodes by depositing a material for the source and drain electrodes on the resultant structure of the first photomask process and patterning the deposited material via a second photomask process, wherein the source electrode is connected to a first side of the semiconductor layer and extends onto a first portion of the second layer, and the drain electrode is connected to a second and opposite side of the semiconductor layer and extends onto a second portion of the second layer and is spaced-apart from the source electrode by a distance, wherein inner sides of the source and drain electrodes and an inner side of the second layer are arranged on a same plane; and forming a gate electrode at a location that corresponds to the semiconductor layer by depositing an insulating layer and then a material for a gate electrode on the resultant structure of the second photomask process and then patterning the material for the gate electrode via a third photomask.

14. The method of claim 13, further comprising forming alignment keys spaced apart from the semiconductor layer by a distance and at corners of the base layer, the alignment keys comprising a third layer comprised of a same material as that of the second layer.

15. The method of claim 14, wherein the alignment keys further comprise a fourth layer arranged underneath the third layer and comprising a same material as that of the first layer.

16. The method of claim 13, wherein the source and drain electrodes are patterned so that outer sides of the source and drain electrodes and an outer side of the semiconductor layer are arranged on a same plane.

17. The method of claim 13, wherein the first layer comprises a material that has an etch selectivity with respect to the source and drain electrodes and the second layer.

18. The method of claim 13, further comprising forming ohmic contact layers by depositing a material for the ohmic contact layers and then patterning the material for the ohmic contact layers during the second photomask process.

19. The method of claim 18, wherein the second photomask process further comprises etching the second layer in a same process as the patterning of the material for the ohmic contact layers.

20. The transistor substrate manufactured by the method of claim 13, further comprised of:

alignment keys formed at corners of the base layer and spaced apart from the semiconductor layer by a distance, the alignment keys comprising a third layer comprised of a same material as that of the second layer; and the first layer comprising a material that has etch selectivity with respect to the source and drain electrodes and the second layer.

* * * * *